United States Patent [19]

Yu et al.

[11] Patent Number: 4,744,056
[45] Date of Patent: May 10, 1988

[54] STABLE HIGH DENSITY RAM

[75] Inventors: James Yu; Hong-Gee Fang; Moon-Yee Wang, all of San Jose; Robin W. Cheung, Cupertino, all of Calif.

[73] Assignee: Advanced Micro Devices, Inc., Sunnyvale, Calif.

[21] Appl. No.: 835,081

[22] Filed: Feb. 28, 1986

[51] Int. Cl.[4] .............................................. G11C 11/00
[52] U.S. Cl. ...................................... 365/154; 365/51; 357/41
[58] Field of Search ..................... 365/154, 51, 63, 72, 365/182; 357/41, 23.7

[56] References Cited

U.S. PATENT DOCUMENTS 4,541,006  9/1985  Ariizumi et al. ................. 365/154 X Primary Examiner—Joseph A. Popek
Attorney, Agent, or Firm—Patrick T. King; Paul Hentzel; John P. Taylor

[57] ABSTRACT

The substrate active region contains the source and drain regions for the transistors in each cell. The grounded drains of the two pulldown transistors extend symmetrically into the three adjacent cells coupling with six other pulldown drains. This common ground node has a single upward contact to the metal ground lead. The poly-2 has a similar voltage node coupling eight pulldown resistors in four adjacent cells to the metal Vdd lead. The poly-2 forming the lightly doped resistor area has a heavily doped conductive area at each end for coupling the resistor into the pulldown circuit. The pulldown gate bands have 45 degree bends to maximize the gate area relative to the pass gate area. The gate bends cooperate with corresponding 45 degree slants in the edges of the active region to minimize the effect of misalignment. A conductive poly word line forms the pass gates just above the active region. A metal word line connects periodically with the poly word line to minimize the effect of the distributive resistance of poly. Poly-2 is used to build up the contact from the drains of the pass transistor in the substrate active region to the metal bit leads. The lateral spread of the contact aperture is limited leaving a marging of insulating oxide between the bit contact and the pass gate structure.

69 Claims, 9 Drawing Sheets

STABLE HIGH DENSITY RAM

BACKGROUND OF THE INVENTION

1. Field of the Invention

This invention relates to random access memories (RAMs), and more particularly to a high density layout for fast, stable RAMs.

2. Description of the Related Art

Heretofore, RAMs have employed conductive polysilicon material for the row word line. The distributed resistance of the poly was typically 25-100 ohms per square, which is high when compared to aluminum metal at less than 0.1 ohms per square. The relatively high poly resistance resulted in a high RC time constant and corresponding delays in the word line access cycle. The poly word line approach places design limitations on the number of memory cells permitted in a single word line.

The blanket silicon oxide layers used for insulation in integrated circuits require etched contact apertures. The etching material developes a slope along the aperture edge, which produces a lateral expansion of the aperture area. For apertures that penetrate several layers of insulative oxide, this expansion is cumulative and results in a high volume wide-deep aperture that is filled with metal or conductive poly. These large apertures take up cell space and reduce the insulation between the contact material in the aperture and the adjacent active elements. Narrow-deep apertures frequently have unfavorable aspect ratios (diameter over depth), and are difficult to fill during metal deposition.

SUMMARY

It is therefore an object of this invention to provide an improved random access memory (RAM) and a method of manufacture therefor.

It is another object of this invention to provide a higher density, faster, and more stable memory cell within a RAM and a method of manufacture therefor.

It is a further object of this invention to provide a memory cell in which polysilicon material within a single layer functions as both the pulldown resistor and the conductive leads at each end thereof.

It is a further object of this invention to provide a four cell repeating memory unit having a common ground node for the four cells and the a method of manufacture.

It is a further object of this invention to provide a four cell repeating memory unit having a common supply voltage node for the four cells.

It is a further object of this invention to provide memory cells having transistors with a higher alpha particle immunity.

It is a further object of this invention to provide memory cells having aperture contacts with a favorable aspect ratio and with minimum lateral spreading and a method of manufacture therefor.

It is a further object of this invention to provide a RAM with memory cells having a lower alignment sensitivity.

BRIEF DESCRIPTION OF THE DRAWING

Other objects, features and advantages of the present invention will become apparent upon consideration of the following detailed description and drawing, in which:

FIGS. 1, 2, 3, 5, 6, and 7 are not drawn to scale. FIG. 4 is drawn to scale as part of the preferred embodiment to illustrate the memory cell structure of an IC fabricated in accordance with the present invention.

Figure 1:
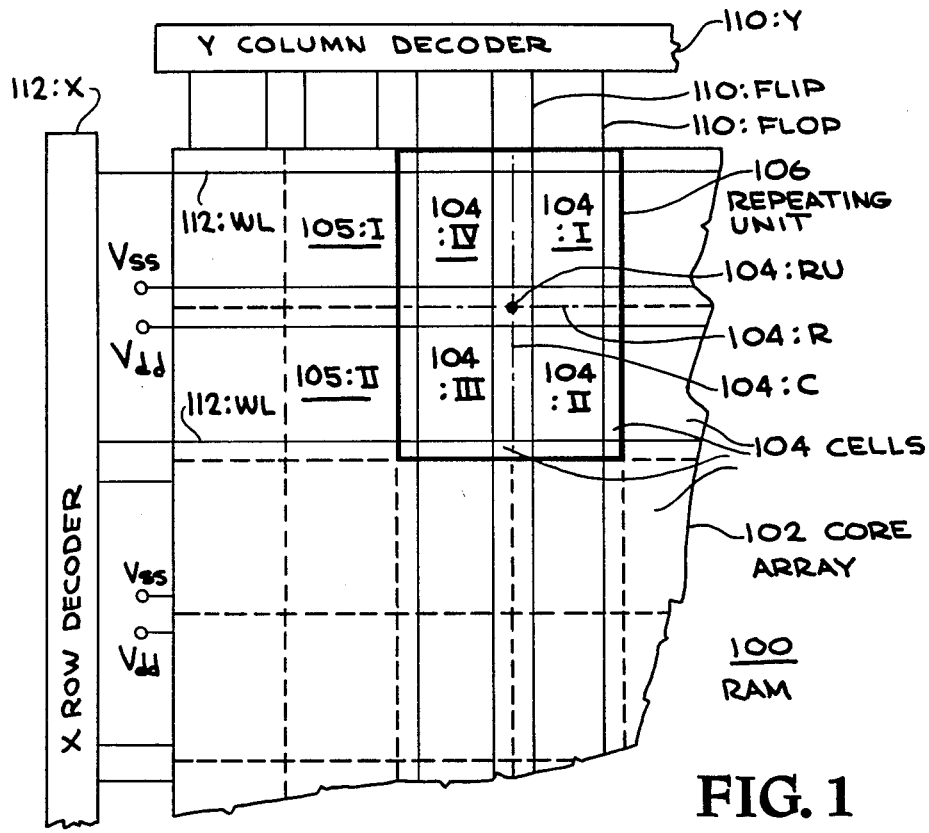
FIG. 1 is a block diagram of a RAM showing the access circuitry and a portion of the memory cell array.

Each element of the invention is designated by a three digit reference numeral. The first digit indicates the Figure in which the element is first disclosed or described. The second and third digits indicate like features and structural elements throughout the Figures. Some reference numerals are followed by a letter which indicates a subportion of that element.

GENERAL RAM DESCRIPTION (FIG. 1)

Random access memory (RAM) 100 (see FIG. 1) is formed by core array 102 of bi-state memory cells 104 (dashed lines) arranged in X rows and Y columns. Array 102 is formed within a lightly doped P well, and has N doped regions forming the cell transistors. Each memory cell 104 has a FLIP conductive state representing one of the binary numbers "1" or "0"; and a FLOP conductive state representing the other one of the binary numbers.

A fundamental repeating layout pattern is formed by rectangular unit 106 (bold lines) containing four cells 104:I, 104:II, 104:III, and 104:IV; one cell in each quadrant of the repeating unit. The quadrants are defined by row centerline 104:R and column centerline 104:C which intersect at point 104:RU at the center of repeating unit 106. Two cells 105:I and 105:II of an adjacent repeating unit are also shown.

A pair of column address bit leads 110:FLIP and 110:FLOP from Y address decoder 110:Y extend across each column of cells 104. Two pair of bit leads 110 address each column of repeating units 106. A row address word line 112:WL from X address decoder 112:X extends across each row of cells 104. Two row word leads 112:WL addresss each row of repeating units 106. A single Vss row buss also extends across each row of repeating units 106 for providing the operating ground (first voltage) to core array 102. A single Vdd row buss extends across each row of repeating units 106 for supplying the operating supply voltage (second voltage) to core array 102. One Vdd buss and one Vss buss service the two adjacent rows of cells 104 within each repeating unit 106.

GENERAL CELL DESCRIPTION (FIG. 2)

Figure 2:
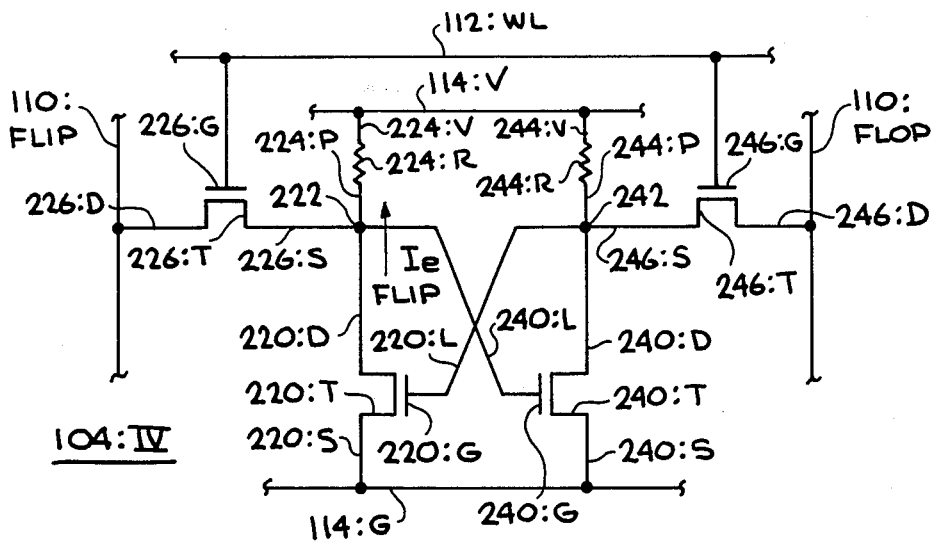
FIG. 2 is a schematic diagram (textbook format) of a single cell within the RAM of FIG. 1 showing the pulldown transistors and the pass transistors.

A four transistor, bi-state memory cell 104:IV is shown in textbook format in FIG. 2. Cell 104:IV has a "FLIP" conductive state in which FLIP pulldown transistor 220:T conducts; and a "FLOP" conductive state in which FLOP pulldown transistor 240:T conducts. When cell 104:IV is in the "FLIP" state, FLIP pulldown transistor 220:T conducts, causing electron current Ie:FLIP therethrough to flow from ground at Vss node 114:G to source 220:S, across high gate 220:G to drain 220:D at FLIP node 222. Ie:FLIP flows through load resistor 224:R from pulldown end 224:P at FLIP node 222, to high voltage end 224:V at Vdd node 114:V to maintain node 222 at a low voltage. FLOP node 242 is high and maintains FLIP transistor 220:T conductive through FLIP gate lead 220:L. The low voltage on node 222 appears on gate 240:G of FLOP pulldown transistor 240:T through gate lead 240:L for maintaining transistor 240:T non-conductive during the FLIP state. The low node voltage also appears on source 226:S of FLIP pass transistor 226:T. FLIP pass transistor 226:T is non-conductive during the FLIP state, because bit line 110:FLIP coupled to drain 226:D and word line 112:WL coupled to gate 226:G, are both low. The FLOP side of cell 104:IV has corresponding elements which function in a corresponding manner during the FLOP state.

During READ, the state of cell 104:IV is determined by selecting word line 112:WL, which raises the voltage at pass gates 226:G and 246:G. Both pass transistors 226:T and 246:T become potentially conductive. When bit lines 110 are selected for cell 104:IV, the applied READ voltage drops faster on the bit line to the conductive pulldown transistor, indicating one of the conductive states. For the FLOP state FLOP pulldown transistor 240:T is conductive, and bit line 110:FLOP drops first.

During WRITE, a precharge pulse is applied to word line 112:WL. One of the bit lines 110 is raised while the other remains at ground, causing the cell to assume the desired state. To effect a FLOP state, bit line 110:FLOP is raised causing a high voltage to appear on FLOP gate 240:G. FLOP pulldown transistor 240:T conducts forcing FLIP transistor 220:T into non-conduction.

GENERAL LAYOUT DESCRIPTION (FIG. 3)

Figure 3:
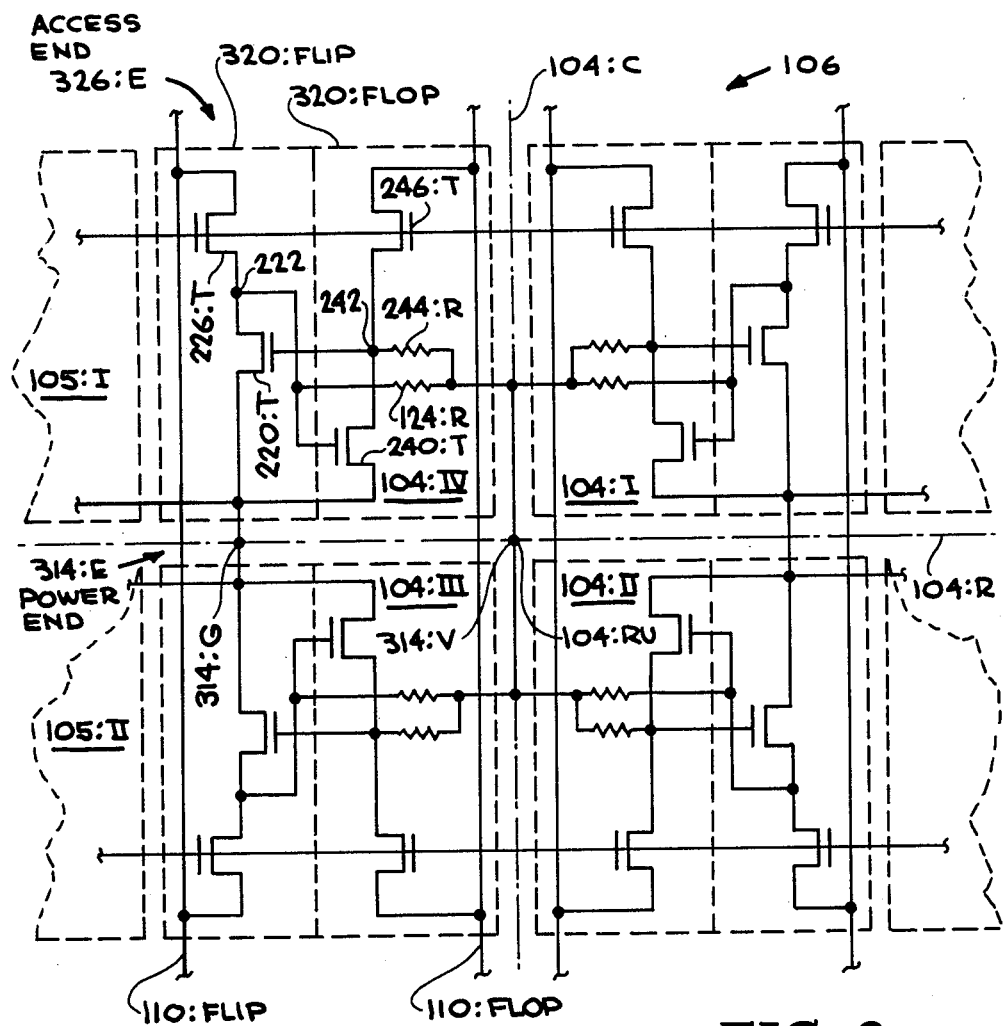
FIG. 3 is a schematic diagram of the single cell of FIG. 1 and adjacent cells, showing the repeating pattern and symmetry of the cell layout.

Repeating memory unit 106 is shown in actual layout format in FIG. 3. Unit 106 is divided into four cell quadrants 104:I, 104:II, 104:III, and 104:IV by row and column centerlines 104:R and 104:C. Each quadrant contains one memory cell. Cell 104:I is the mirror image of cell 104:IV. Cells 104:II and 104:III together form the mirror image of cells 104:I and 104:IV.

Each cell 104 has a FLIP section 320:FLIP (dashed lines) containing FLIP transistors 220:T and 226:T, FLIP node 222, and bit line 110:FLIP. Each cell 104 also has a FLOP section 340:FLOP (dashed lines) containing FLOP transistors 240:T and 246:T, FLOP node 242, and bit line 110:FLOP. Each repeating unit has voltage node 314:V (for the four adjacent cells 104:I, 104:II, 104:III, and 104:IV), and ground node 314:G (for four adjacent cells 104:IV, 104:III, 105:II, 105:I). Nodes 314:V and 314:G are located at power end 314:E of each cell. Pass transistors 226:T and 246:T are located at access end 326:E of each cell 104.

MANUFACTURE OF RAM (FIGS. 4-A to 4-G)

The physical layout of cell 104:IV (and portions of adjacent cells 104:I, 104:II, 104-III, 105-II and 105:I) is shown layer by layer in FIGS. 4-A to 4-G illustrating fabrication progress starting with wafer substrate 460 in FIG. 4-A. The structure added by each layer in each manufacturing step is indicated in bold lines and hatched (first appearance only).

The CMOS techniques used in the manufacture of RAM 100 are disclosed in detail in the 1980 publication of the International Electron Device Meeting (IEDM) in an article by Lewis C. Parrillo at Bell Labs concerning twin well CMOS procedures. The disclosure in this IEDM publication is hereby incorporated by reference in its entirety. The device in the embodiment shown has a P well with N channels. However, the invention is applicable to P-MOS channel devices.

FORM SOURCE-DRAIN ACTIVE REGION (FIG. 4-A)

Figure 6:
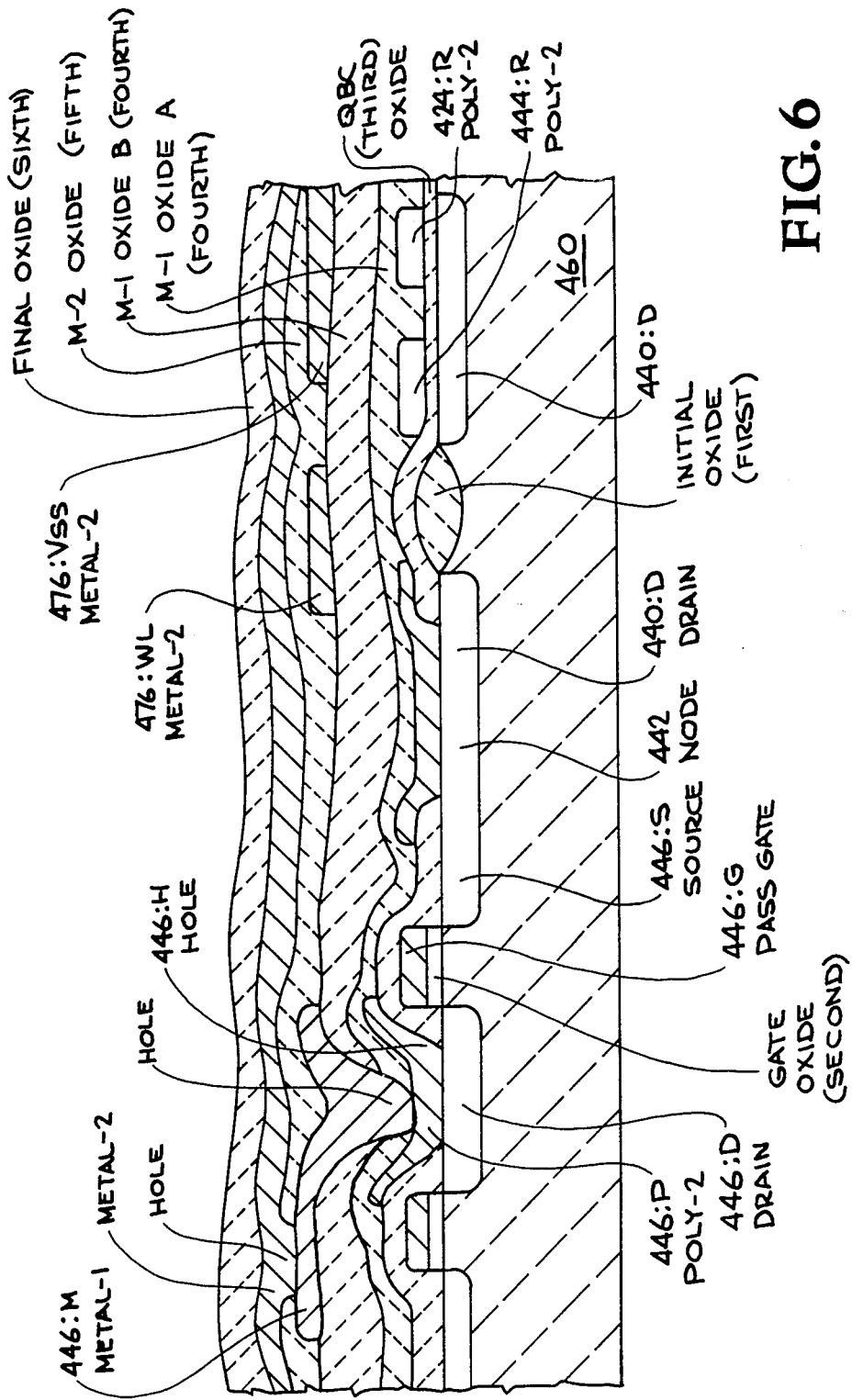
FIG. 6 is a sectional view taken across the flop section (lines 6—6) showing the oxide layers.

STEP (A) Mask substrate 460 (lightly P doped) and form a first or initial oxide (shown in FIG. 6) forming isolation areas 461. The non-oxide area defines source-drain active region 462:A (bold lines with hatch in FIG. 4-A). Region 462:IV (in qudrant 104:IV) is shown in full and forms the sources, drains, and channels of pulldown transistors 220:T and 240:T and pass transistors 226:T and 246:T for cell 104:IV (see FIG. 4-C).

Adjacent regions 462:I (in quadrant 104:I) and 462:II (in qudrant 104:II) and 462:III (in quadrant 104:III), are partially shown and combine with region 462:IV to form a symmetrical pattern about center 104:RU of repeating unit 104. Region 462:IV also combines with the source-drain regions in adjacent quadrants 104:III and 105:II and 105:I to form a one piece repeating pattern region which is arranged symmetrically about source-drain or substrate center 405:SD at the intersection of column centerline 405:C and on row centerline 104:R (shifted one half unit from unit center 104:RU). Preferably, center 405:SD coincides with ground node 314:G (for Vss, the first voltage), and unit center 104:RU coincides with voltage node 314:V (for Vdd, the second voltage). The cell symmetry supports electrical equivalence between cells.

FORM POLY-1 GATES (466 in FIG. 4-B)

STEP (B-1) Form a blanket layer of a suitable second insulating material such as second oxide (undoped, shown in FIG. 6) over source-drain active regions 462:A and substrate 460.

STEP (B-2) Form a blanket layer of doped polysilicon (poly-1) over the undoped gate oxide. The poly-1 is masked and etched defining gate structures 466 and gate channels thereunder for the four transistors in cell 104:IV (bold lines in FIG. 4-B):

Pass gate structure 466:Pass which includes
  pass gates 426:G and 446:G (cross hatched),
  gate channels 426:C and 446:C thereunder,
  and the pass row lead (hatched).
Pulldown gate structure 466:FLIP which includes
  gate 420:G (cross hatched),
  gate channel 420:C thereunder,
  gate lead 420:L (hatched), and
  misalignment overlap area 420:O (hatched).
Pulldown gate structure 466:FLOP which includes
  gate 440:G (cross hatched)
  gate channel 440:C thereunder,
  and gate lead 440:L (hatched), and
  misalignment overlap area 440:O (hatched).

Gate structures 466 provide the actual active gate area (cross hatched) and the conductive leads (hatched) coupling gates 466 to the related elements.

FORM N+ SOURCES AND DRAINS (FIG. 4-C)

STEP (C) Mask the isolation area 461 surrounding active region 462:A, to permit N doping (by diffusion or implant) of the source-drain active region. Region 462:IV is divided into five N+ doped regions (bold lines with hatch in FIG. 4-C) separated by the channels 420:C, 426:C, 440:C, and 446:C under gate structure 466 to form transistor sources and drains:

N+ doped pass drain 426:D.

N+ doped pass drain 446:D.

N+ doped flip node 422 which includes drain 420:D and source 426:S.

N+ doped flop node 442 which includes drain 440:D and source 446:S.

N+ doped ground node 414:G which includes source 420:S and source 440:S.

Each adjacent cell (not shown) also has five corresponding N+ doped regions formed in corresponding source-drain regions.

FORM CONTACT HOLES FOR QBC (FIG. 4-D)

STEP (D-1) Form a blanket layer of a suitable third insulating material such as third oxide (shown in FIG. 6) over substrate 460 and the source-drain regions and gate structures 466 to provide an insulative layer.

STEP (D-2) Form quasi buried contact (QBC) apertures in the QBC (third) oxide to permit metal leads to contact elements in the source-drain regions in region 462. The QCB apertures (bold lines with hatch FIG. 4-D) are:

Flip node apertures 422:A for coupling node 422 to resistor 424:R (see FIG. 4-E) through poly-2 lead 424:P (see FIG. 4-E).

Flop node aperture 442:A for coupling node 442 to resistor 444:R (see FIG. 4-E) through poly-2 lead 444:P (see FIG. 4-E).

Gate lead aperture 440:A for coupling poly-2 lead 422:P to gate 440:G.

Flip lead aperture 426:A for coupling pass drain 226:D to bit leads 110:FLIP.

FLop lead aperture 446:A for coupling pass drain 246:D to bit leads 110:FLOP.

Ground node aperture 414:GH for coupling ground node 414:G in region 462 to the Vss buss (see FIG. 4-F).

FORM POLY-2 LEADS (FIG. 4-E)

STEP (E-1) Form a blanket layer of undoped polysilicon (poly-2) over the QBC oxide filling the QBC aperatures.

STEP (E-2) Lightly dope the poly-2 layer (by diffusion or implant) to a resistivity of about 10 giga-ohms per square.

STEP (E-3) Define the pulldown resistor area by depositing a blanket layer of photoresist over the lightly doped poly-2 layer, and masking and etching defining resistor mask 470 (dotted lines FIG. 4-E) and exposing the remainder of poly-2. The high resistance poly-2 under resistor mark 470 will become pulldown resistors 424:R and 444:R.

STEP (E-4) Heavily dope the exposed poly-2 (by diffusion or implant) to a resistivity of about 100 ohms per square. Resistor mask 470 stops the implant and the area thereunder remains highly resistive.

STEP (4-5) Remove resistor mask 470 exposing pulldown resistors 424:R and 444:R.

STEP (4-6) Mask and etch the exposed poly-2 (both the resistance and conductive areas), to form:

Flip lead poly 426:P for contacting pass drain 226:D through aperture 426:A.

Flop lead poly 446:P for contacting pass drain 246:D through aperture 446:A.

Flip lead 472:FLIP for coupling node 414:V to node 422 through aperture 422:A.

Flop lead 472:FLOP for coupling node 414:V to node 442 through aperture 442:A.

Flip pulldown resistor 424:R (cross hatched) extending from Vdd voltage node 414:V to poly-2 conductive lead 472:FLIP.

Flop pulldown resistor 444:R (cross hatched) extending from Vdd voltage node 414:V to poly-2 conductive lead 472:FLOP.

Resistor lead 424:V at the voltage end of pulldown resistor 424:R.

Resistor lead 444:V at the voltage end of pulldown resistor 444:R.

Resistor lead 424:P at the pulldown end of pulldown resistor 424:R.

Resistor lead 444:P at the pulldown end of pulldown resistor 444:R.

A single poly-2 structure forms both high resistance pulldown resistors and the conductive leads at both ends thereof. Poly-2 materials forms a one piece structure symmetrically extending into the four adjacent cells 104:I, 104-II, 104-III, and 104-IV, centered about repeating unit or poly center 104-RU at voltage node 414:V.

FORM METAL-1 CONDUCTORS (FIG. 4-F)

STEP (F-1) Form a blanket layer of a suitable fourth insulative material such as fourth oxide (shown in FIG. 6) to provide an insulative layer between poly-2 leads 472 and the metal-1 conductors. This M-1 oxide is masked and etched to form three QBC apertures (dashed lines FIG. 4-F) in registration with QBC apertures 426:A and 446:A and 414:GH in the third oxide, permitting metal-1 to contact poly-2 leads 426:P and 446:P and ground node 414:G. In addition, voltage node aperture 414:VH (dashed lines FIG. 4-F) is formed in the M-1 oxide for coupling poly-2 voltage node 414:V (see FIG. 4-E) to the Vdd row buss.

STEP (F-2) Form a blanket layer of aluminum (metal-1) over the M-1 oxide and etch to form:

Voltage row buss 475:Vdd for contacting voltage node 414:V through aperature 414:VH in the M-1 oxide.

Ground row buss 476:Vss for contacting ground node 414:G through aperture 414:GH (third oxide) and the corresponding M-1 oxide aperture.

Word line row buss 476:WL.

Metal contact 426:M for contacting drain 226:D through aperture 426:A (third oxide), lead 426:P, and the corresponding M-1 oxide aperture.

Metal contact 446:M for contacting drain 246:D through aperture 446:A (third oxide), lead 446:P, and the corresponding M-1 oxide aperture.

Metal contacts 426:M and 446:M are identically shaped, but reversed in orientation.

RAM 100 receives ground (the first voltage) through ground buss 476:Vss formed by highly conductive metal-1, in order to conserve space on the substrate. Further, a single contact between metal buss 476:Vss and local gound node 414:G through aperture 414:GH, establishes ground for four adjacent memory cells 104 for minimizing contact space within active region 462:A on substrate 460. Ground node 414:G within cell 104:IV forms a one piece conductive N region which includes the ground nodes within adjacent cells 104:III and 105:II and 105:I.

RAM 100 receives the supply voltage (the second voltage) through voltage buss 476:Vdd formed by highly conductive metal-1. Further, a single contact between metal buss 476:Vdd and local voltage node 414:V through aperature 414:VH, establishes voltage to four adjacent memory cells 104 for minimizing contact space within active region 642:A on substrate 460 and within the poly-2 layer. Voltage node 414:V within cell 104:IV is a one piece conductive poly element which includes the voltage nodes within adjacent cells 104:I and 104:II and 104:III.

In order to further conserve space in the source-drain layer and the poly-2 layer, ground node 414:G and voltage node 414:V are alined with centerline 104:R. Voltage buss 476:Vdd and ground buss 476:Vss run parallel on either side of centerline 104:R with extensions 476:GE and 476:VE extending therefrom into aperatures 414:GH and 414:VH.

FORM METAL-2 CONDUCTORS (FIG. 4-G)

STEP (G-1) Form a blanket layer of a suitable fifth insulating material such as fifth oxide (shown in FIG. 6) to provide an insulative layer between the metal-1 conductors and the metal-2 conductors. This M-2 oxide is masked and etched to form bit line apertures (dashed lines FIG. 4-G):

Aperture 426:O which is offset from M-1 oxide aperture 426:A.

Aperture 446:O which is offset from M-1 oxide aperature 446:A. The M-2 oxide apertures permit metal-1 to metal-2 contact while avoiding a "stacked" contact directly above drains 426:D and 446:D.

STEP (G-2) Form a blanket layer of aluminum (metal-2) over M-2 oxide and etch to form:

Flip column bit lead 478:FLIP for contacting contact 426:M through aperture 426:O.

Flop column bit lead 478:FLOP for contacting contact 446:M through aperture 446:O.

STEP (G-3) Form a blanket layer of a suitable insulating material such as of a sixth and final oxide (shown in FIG. 6) over the metal-2 aluminum for scratch protection.

TWO WORD LINES (FIG. 5)

Row address word line 112:WL within array 102 is formed by two word line (WL) row leads that cooperate in parallel: buried poly-1 lead 466:Pass (resistivity of about 50–70 ohms per square) and metal-1 lead 476:WL (resistivity of about 0.1 ohms per square) The poly WL lead forms the conductive portion of the transistor pass gates within each cell, and the coupling word line between adjacent cells. The relatively high resistance of poly lead 466:Pass creates RC time constant limitations, and is therefore supplemented by the highly conductive metal word line 476:WL.

Figure 5:
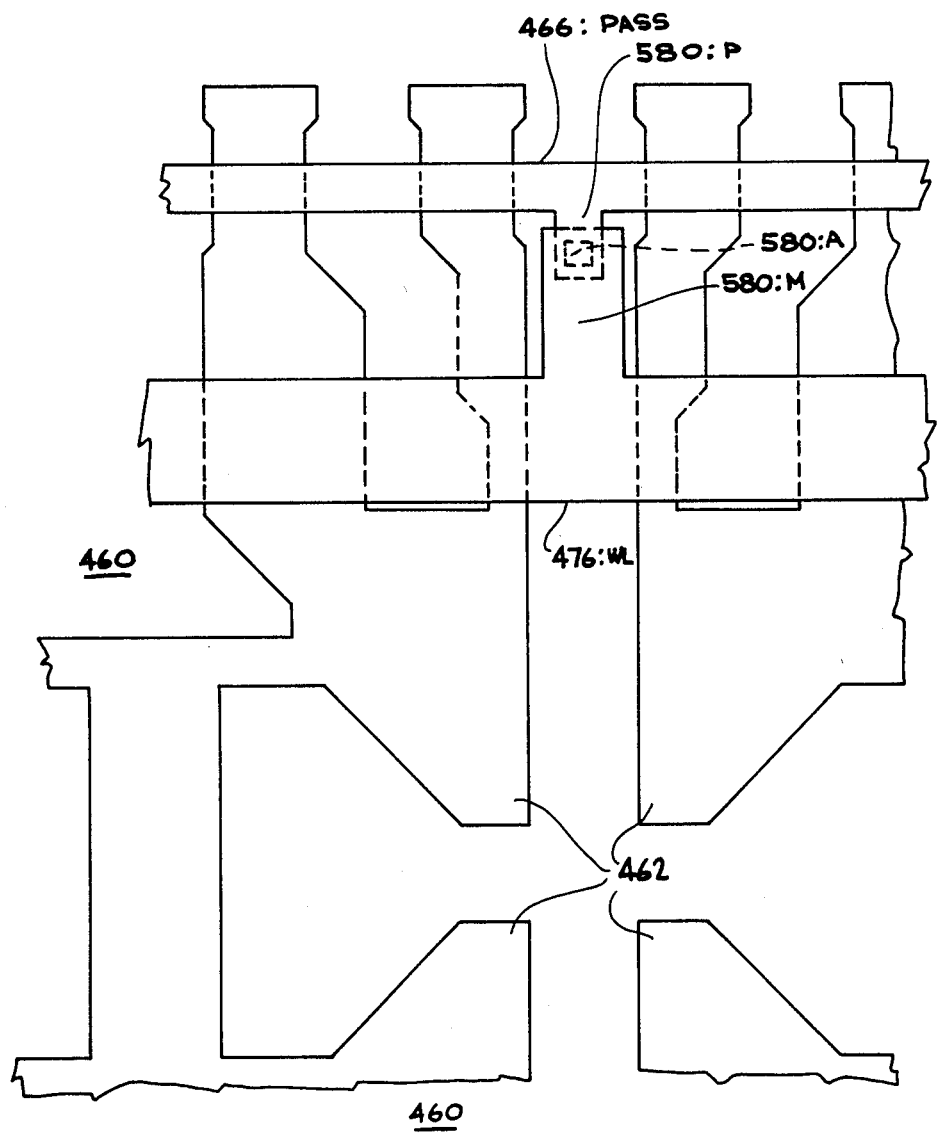
FIG. 5 is a fragmentary view of the two word line (WL) leads and the interconnection lead therebetween.

Word line interconnections 580 (see FIG. 5) are provided between the poly WL lead and the metal WL lead at spaced intervals along each row. A poly-1 interconnect tab 580:P extends from poly-1 lead 466:Pass to contact a corresponding metal-1 interconnect tab 580-M extending from metal lead 476:WL. Contact aperture 580:A is provided in the M-1 oxide to permit the aluminum from the metal-1 tab to contact poly-1 tab thereunder. In the preferred embodiment an interconnect 580 is provided every 16 cells (between each eigth repeating pattern of drain-source region 462).

ASPECT RATIO-CONTACT APERTURES (FIG. 6)

Metal-2 must extend through many oxide layers to reach pass drains 426:D and 446:D. The poly-2 in apertures 426:A and 446:A builds-up the contact level to avoid a large contact step later when bit leads 110 are formed. The poly-2 build up separates the oxide layers and prevents cumulative spreading of the contact aperture caused by the repeated etching steps. The metal-1 in these apertures builds-up the contact level at the M-1 oxide layer.

Without the poly-2 and metal-1 build up, apertures 426:A and 446:A would become larger with each oxide layer and etch. The smaller apertures of the present invention permit a thicker margin of insulating oxide between the drain contacts and the pass gate (see FIG. 6). Drains 426:D and 442:D serve the poly WL in each of the two adjacent cells due to the cell-to-cell symmetry (mirror image across row centerline 405:R). Proper insulation is maintained between these drains and the poly WL by employing the poly-2 build-up.

The aspect ratio of the metal-2 to drain contact is improved by offset apertures 426:O and 446:O. The offset (see FIG. 6) permit metal-1 to metal-2 contact while avoiding a "stacked" contact directly above drains 426:D and 446:D.

MISALIGNMENT COMPENSATION (FIG. 4-B)

Gate overlap portions 420:O and 440:O (see FIG. 4-B) provide for gate position displacements within the fabrication misalignment tolerance. The width of pulldown channels 420:C and 440:C under gates 420:G and 440:G is preferably three times the width of pass channels 426:C and 446:C under gates 426:G and 446:G. The 3:1 ratio provides a balance between switching speed and cell stability during the READ and WRITE cycles.

A portion of each pulldown gate extends at a 45 degree slant with respect to the rows and columns, in order to maximize the gate width while conserving space within active region 462:A. The remainder of each gate extends in the row or column direction.

Changes in pulldown gate width due to misalignment are minimized by the geometric relationship between each gate and the edges of the underlying active region. Gate 420:G passes over the edge of underlying source-drain region 462 at two passover edges; column oriented edge 420:C (near lead 420:L) and slant edge 420:S (near overlap portion 420:O). Gate 420:G extends orthoganal to both of these passover edges.

Downward column misalignments do not cause changes in the gate width at passover edge 420:C because of the lower portion of the column orientation of that edge. At edge 420:S downward misalignment sensitivity is minimized because edge 420:S changes from a slant orientation to a column orientation along the lower end thereof in ground node 414:G. Loss in gate width along the upper end of edge 420:S caused by downward misalignment is compensated by a corresponding increase in gate width along the lower edge. Edge 420:S is downward self-aligning because the small gate area lost to flip node 422:FLIP is replaced by a corresponding small area from ground node 414:G.

Upward misalignment sensitivity is minimized for gate 420:G because edge 420:C changes from a column orientation to a slant orientation along the upper end thereof in flip node 422:FLIP. As the gate area decreases along edge 420:C due to upward misalignment, edge 420:S experiences a compensating increase in area.

Right misalignment sensitivity is minimized because the loss in gate area along edge 420:C is compensated by an increase in area along edge 420:S into ground node 414:G. Left misalignment sensitivity is minimized because the gain in gate area along edge 420:C is 70.7 percent compensated by a gain in gate area along edge 420:S Gate 440:G has similar misalignment provisions by gate width gain and loss along passover edges 440:R and 440:S.

ALPHA PARTICLE PROTECTION (FIG. 7)

Background radiations such as alpha particles from the insulating glass and IC packaging materials, sometimes enter the cell area and strike the pulldown nodes. Heretofore, if the charged node was temporarily ionized, by such an ionizing event, the node charge would be quickly dispersed, causing the node voltage to drop rapidly. The node charge appears on the gate of the conducting transistor and locks the memory in the flip or flop state. The loss of the node charge may cause the memory cell to flip states, introducing an error into the stored data.

Figure 7:
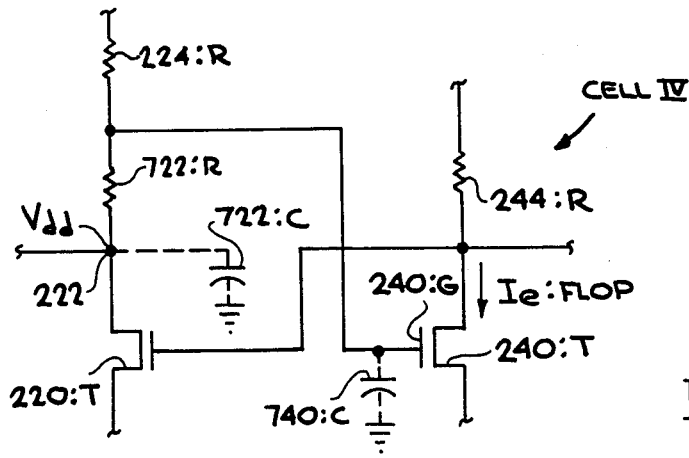
FIG. 7 is a schematic of the flip node showing the flip lead resistance and the flop gate capacitance.
Figure 4A:
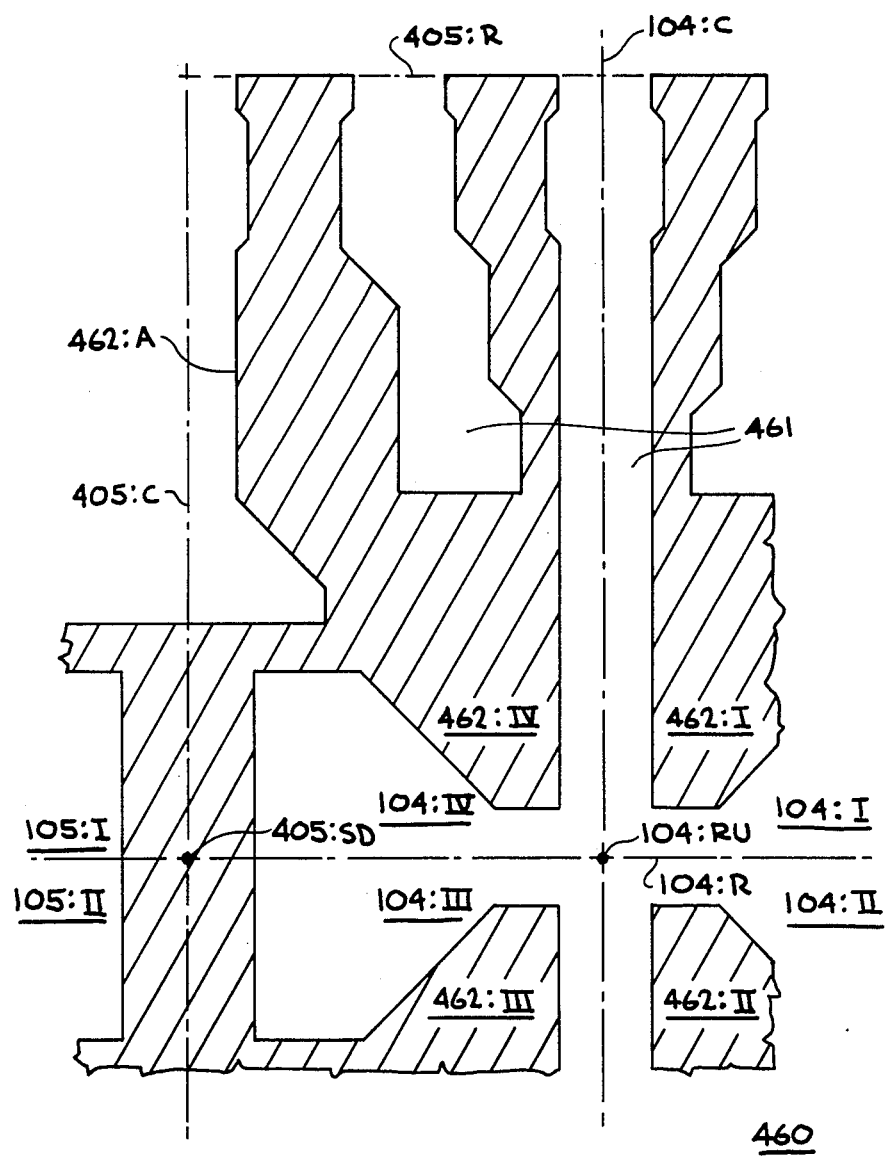
FIGS. 4-A to 4-G show the CMOS fabrication steps for manufacturing the memory cells of FIG. 3.
Figure 4C:
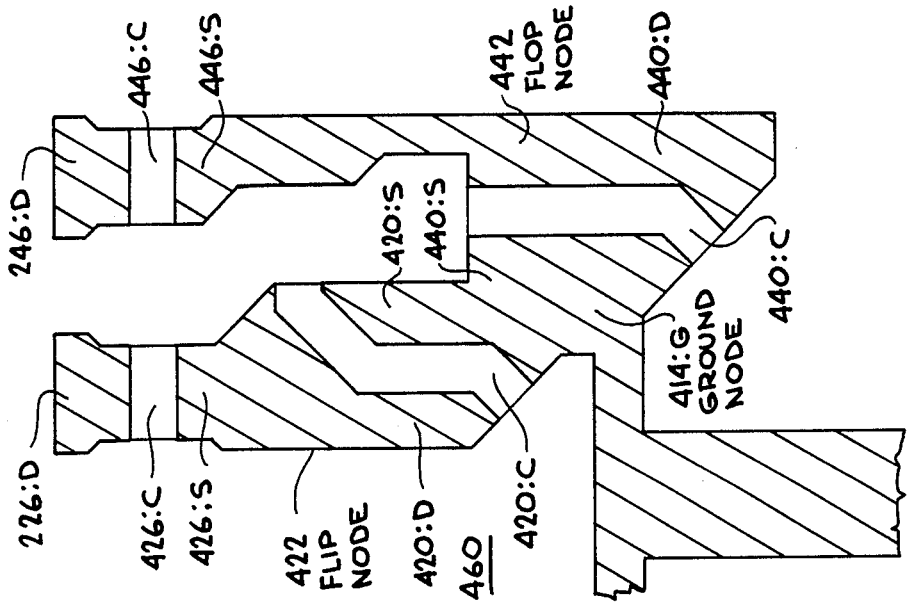
Figure 4B:
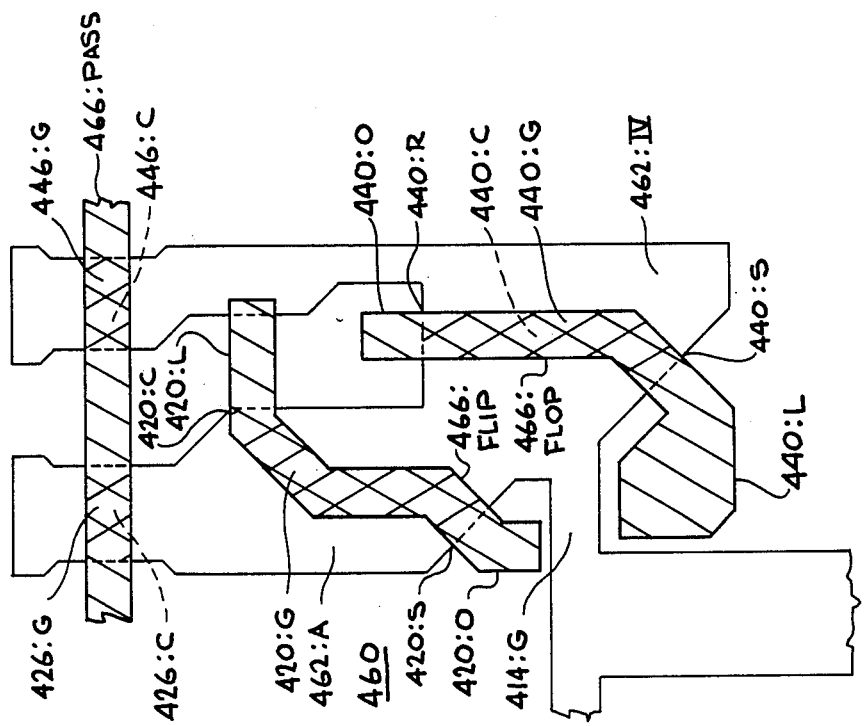
Figure 4E:
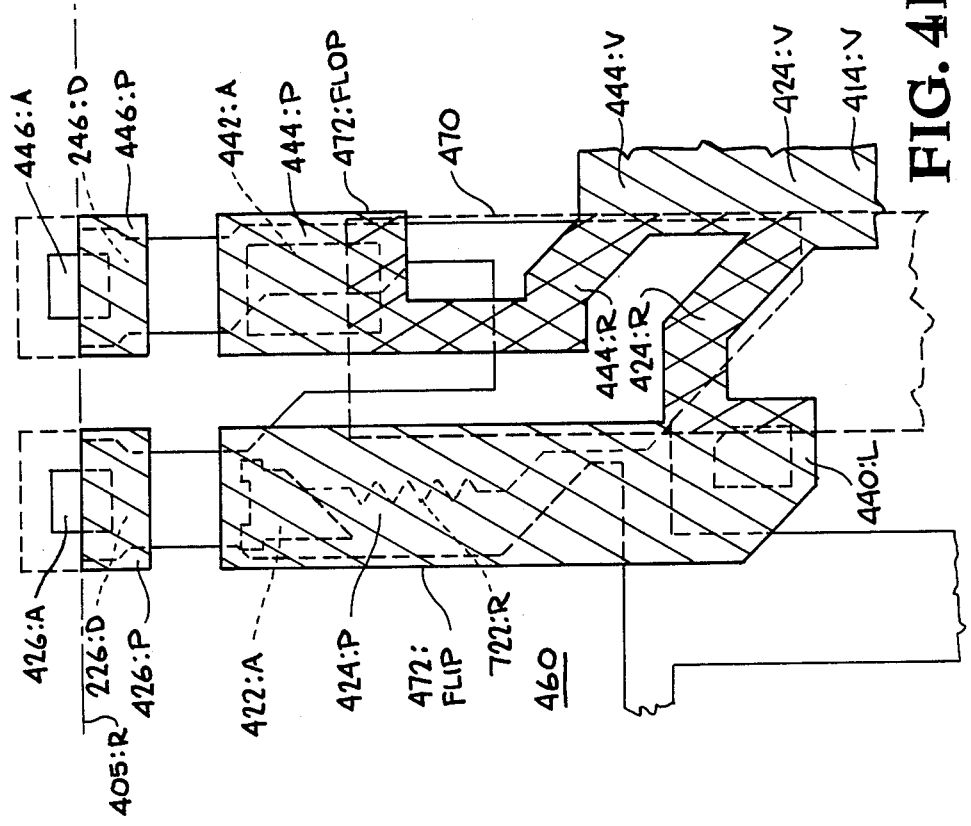
Figure 4D:
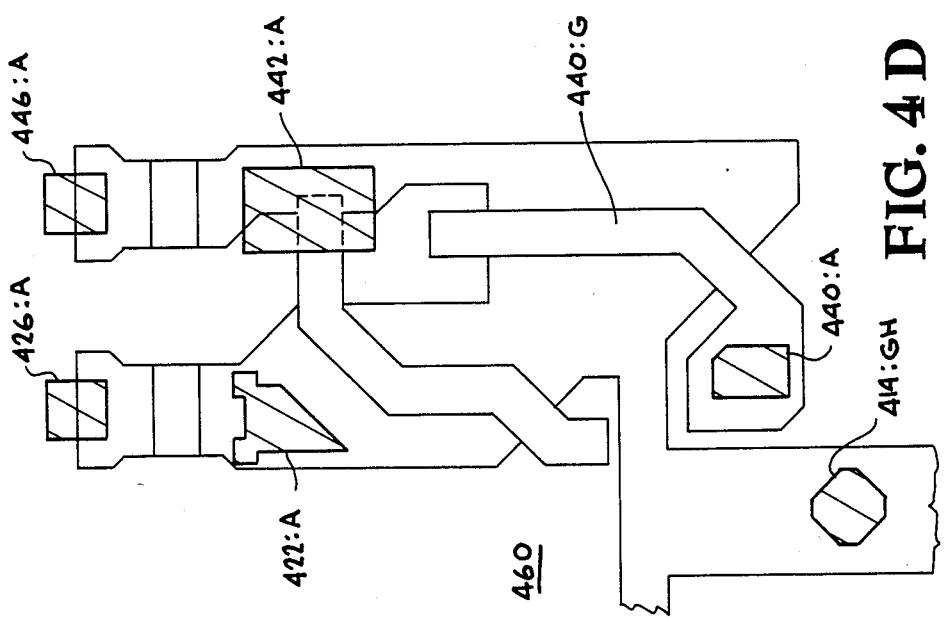
Figure 4F:
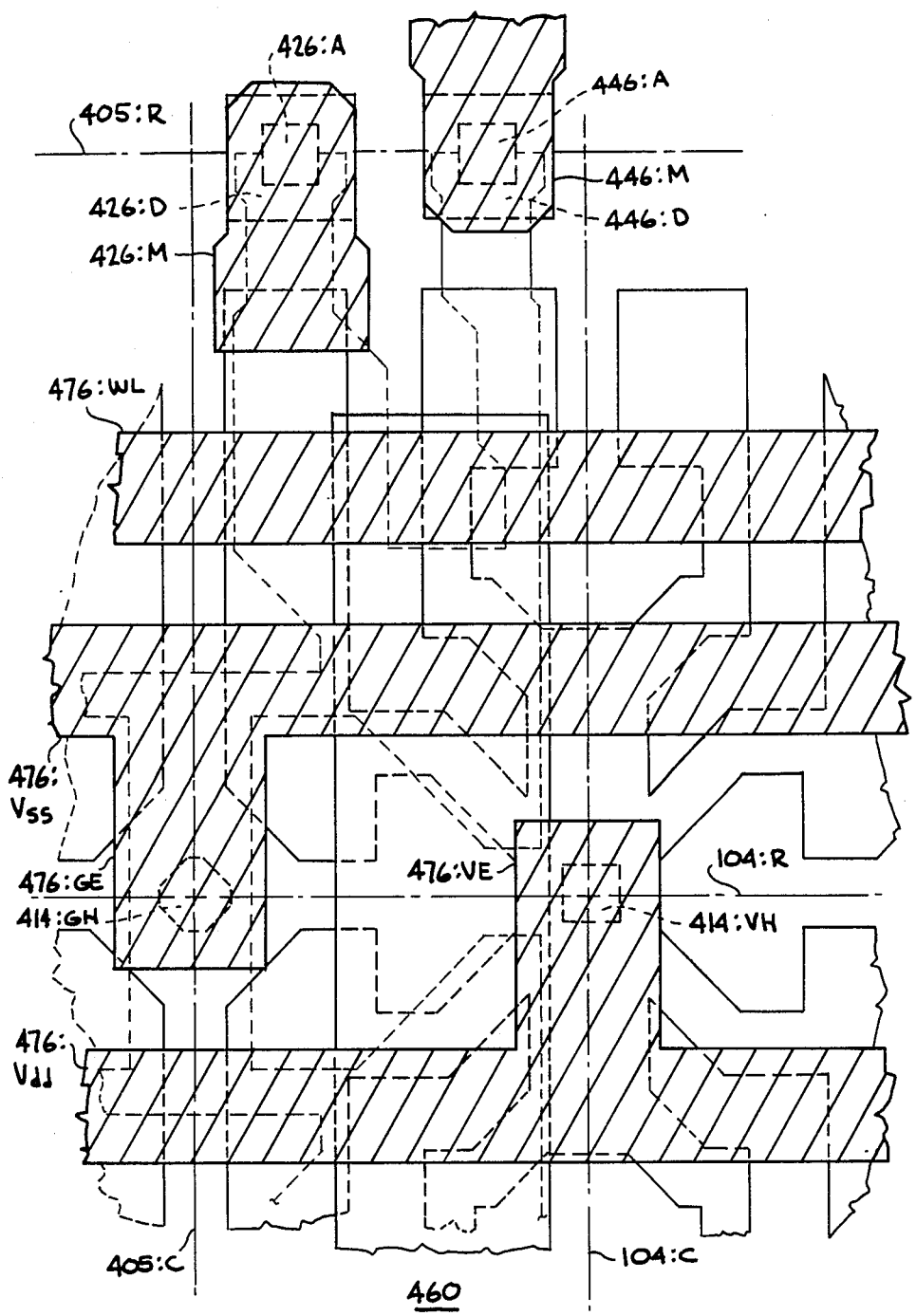
Figure 4G:
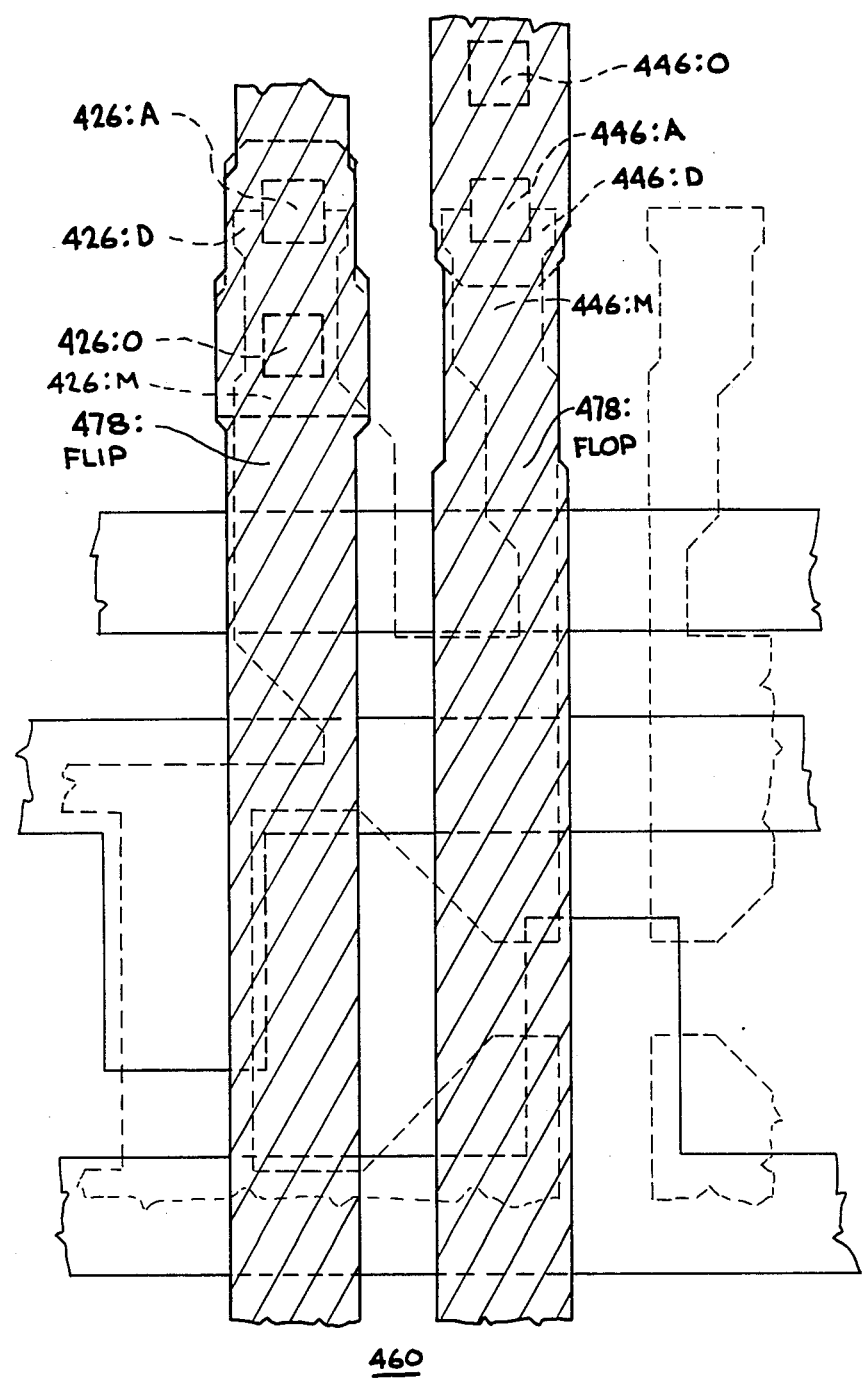

FIG. 7 shows a portion of cell IV with a resistor-capacitor protection against radiation instability. Cell IV is shown in the flop mode, with flop transistor 240:T conducting. Flip node 222 is charged to Vdd because flip transistor 220:T is not conducting. The charge on flip node 222 appears on flop gate 240:G for maintaining the conducting state of flop transistor 240:T. The capacitance 740:C of gate 240:G (about 20 fimto farads) is on the order of ten times greater than the capacitance 722:C of node 222. The resistance 722:R between the two capacitances is the cumulative distributed resistance of flip pulldown lead 472:Flip (from about 500 to about 5,000 ohms).

Gate 240:G is isolated from any ionizing events which short flip node 222 to ground. Lead resistance 722:R provides sufficient resistance to prevent the gate charge from being shorted to ground during the brief event. After the event, gate capacitance 740:C discharges about one tenth of the gate charge into node capacitance 722:C through resistance 722:R. The flop node voltage is restored immediately to a stable level, and is returned to normal operating level in due course by Vdd through pulldown resistor 224:R (about 10 giga ohms per square).

BEST MODE GENERAL METHOD

The drawn to scale FIGS. 4-A through 4-G disclose the preferred size and geometric relations between the elements of the invention. FIG. 4-H is a color rendition shown the exact scale of FIGS. 4-A through 4-G, and will be canceled when exact scale formal drawings are submitted. The width dimensions of poly WL 466:Pass is 1.2 microns, and is the minimum dimension permitted by the alignment tolerance of 1.2 microns. In the embodiment shown, each cell size is 10.8 micron wide from column centerline 104:C (right side) to column centerline 405:C (left side), and 20.1 microns long from row centerline 104:R (bottom) to row centerline 405:R (top).

The following particulars concerning layer thickness and dopant level are given as an illustrative example of forming the cell.

Substrate 460: silicon wafer N doped to about 20 ohms/cm.
Region 462:A: P doped to about 2-4 E15.
Gate Oxide: about 250 Angstroms CVD undoped.
Poly-1: polysilicon about 4,000 Angstroms Phosphor doped 25 ohms/square.
Third Oxide: about 3,000 Angstroms thick CVD undoped.
Poly-2: polysilicon about 1,900 Angstroms resistor area doped with to about 20 giga ohms/square. conductive area doped with to about 100 ohms/square.
M-1 Oxide A: CVD about 3,000 Angstroms undoped.
M-1 Oxide B: CVD about 8,000 Angstroms about 8 percent Phoshor.
Metal-1 476: Aluminum about 5,000 Angstroms.
M-2 Oxide: about 8,000 Angstroms.
Metal-2 478: Aluminum about one micron.
Final Oxide: about 8,000 Angstroms. about 4 percent Phoshor.

The temperatures, times and dimensions given above are illustrative, and not intended as defining the limitations of the invention. Numerous other applications and configurations are possible.

CONCLUSION

The foregoing description of the preferred embodiments of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangable with other steps in order to achieve the same result. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the terminology of the following claims and the legal equivalents thereof.

We claim:

1. A memory cell (104) within an active region (462:A) of an integrated circuit substrate (460) for an X-Y array memory device (100) and accessed by flip-flop Y metal bit leads and an X metal word line (476:WL) from the device, and powered by first and second metal voltage busses (476:Vss 476:Vdd) disposed parallel to said X metal word line comprising:
   a binary memory cell having a flip section and an adjacent flop section, and a power end (314:E) and an access end (326:E);
   a first voltage node (414:G) located at the power end of the cell and formed in the active region thereof;
   first voltage contact means for coupling the first voltage and (414:G) to the first voltage buss;
   a second voltage node positioned at the power end of the cell for coupling with the second voltage buss;
   a pulldown node (422 442) within each section and formed in the cell active region;
   a pulldown resistor means (424:R 444:R) in each section coupled between the pulldown node and the second voltage node means;

a pulldown transistor (220:T 240:T) within each section having a drain (420:D 440:D) included in the pulldown node, and having a source (420:S 440:S) included in the first voltage node, and having a gate (420:G 440:G) responsive to the voltage of the pulldown node in the other section of that cell for establishing mutually exclusive bistate operation of the cell;

a pass transistor (226:T 246:T) within each section positioned at the access end of the cell and having a source (226:S 246:S) included in the pulldown node, and having a drain (226:D 246:D) formed in the cell active region, and having a gate (226:G 246:G);

contact means for coupling each pass transistor drain to one of the Y bit leads and each pass transistor gate to the X word line for that section.

2. The binary cell of claim 1, wherein the transistor gates are formed by:
gate insulative means (gate oxide) over the active region; and
conductive polysilicon gate material (420:G 440:G 426:G 446:G) selectively formed over said gate insulative means.

3. The binary cell of claim 2, wherein the channel of each pulldown gate extends between the first voltage node and the pulldown node of that section, the pulldown gate material (420:G 440:G) having an aligned portion extending in alignment with either said X word line or said Y bit leads and a non-aligned portion.

4. The binary cell of claim 3, wherein the pulldown gate material (420:G 440:G) has an overlap portion (420:O 420:L 440:O 440:L) at each end thereof which extends beyond the edge of the pulldown channel to provide for misalignment during the fabrication of the cell.

5. The binary cell of claim 4, wherein the overlap interface (420:S 420:C 440:S 440:R) at said overlap portion (420:O 420:L 440:O 440:L) between the overlap gate material and the pulldown channel edge is orthoganol.

6. The binary cell of claim 5, wherein the nonaligned portion of the pulldown gate material extends at an angle of 45 degrees with respect to the X and Y directions.

7. The binary cell of claim 5, wherein the overlap interface (420:C 440:R) at one end of each pulldown channel is X or Y aligned, and the overlap interface (420:S 440:S) at the other end of each pulldown gate material (420:G 440:G) is non-aligned.

8. The binary cell of claim 7, wherein an increase or decrease in channel width at either end of the pulldown channel due to fabrication misalignment, is partially compensated by a corresponding decrease or increase in channel width at the other end thereof.

9. The binary cell of claim 2, wherein:
the pulldown resistor means (424:R 444:R) within each cell is formed by a resistor insulative means (resistor oxide) over the gate insulative means and the gate material; and
a polysilicon resistor (472) selectively formed over the resistor insulative means; and
the second voltage node means includes a portion of the polysilicon resistor (414:V).

10. The binary cell of claim 9, wherein:
said portion (414:V) of said polysilicon resistor included in the second voltage node means is conductive; and
the portion of the polysilicon resistor forming the pulldown resistor means is resistive.

11. The binary cell of claim 10, wherein the conductive portion of the resistor poly material is highly doped and the resistive portion of the resistor poly material is less doped.

12. The binary cell of claim 11, further comprising:
pulldown leads (424:P 444:P) at a pulldown end of each pulldown resistor means formed by:
polysilicon resistor extending over the pulldown nodes; and
pulldown contact aperature means (468) in the insulative means between the polysilicon resistor and the pulldown node for permitting the polysilicon resistor to electrically contact the pulldown node.

13. The binary cell of claim 12, wherein the resistance (724:R) of the flip pulldown lead (424:P) is sufficient to prevent discharge of the flop gate capacitance (740:C) into the flip pulldown node during an ionizing event within the flip pulldown lead, and the flop gate capacitance is sufficient to rapidly recharge the flip pulldown node after the ionizing event.

14. The binary cell of claim 13, wherein the resistance of the flip pulldown lead is from about 500 to about 5,000 ohms, and the flop gate capacitance is about 10 times the flip pulldown node capacitance.

15. The binary cell of claim 14, wherein the flip pulldown lead is generally centrally positioned over the flip section, and the flop pulldown lead is positioned over the flop section near the access end, and the pulldown resistor means are positioned over the flop section near the power end.

16. The binary cell of claim 12, wherein the pulldown gate material has an overlap portion at each end thereof which extends beyond the end edge of the pulldown channel to provide for misalignment during the fabrication of the cell.

17. The binary cell of claim 12, wherein one of the overlap portions of the flip gate material forms a flip overlap conductive lead (420:L) for coupling the flip pulldown gate to the flop pulldown node, and one of the overlap portions of the flop gate material (440:G) forms a flop overlap conductive lead (440:L) for coupling the flop pulldown gate to the flip pulldown node.

18. The binary cell of claim 12, wherein the flip overlap lead extends into the flop pulldown aperature means for coupling with the flop pulldown node.

19. The binary cell of claim 12, wherein the flop overlap lead (440:L) extends toward the power end of the cell terminating into a contact area on the gate insulative means, and the resistor insulative means has contact aperture means (440:H) therein over the contact area for coupling the flop overlap lead with the flip pulldown lead.

20. The binary cell of claim 9, further comprising an X insulative means (metal-1 oxide) over the resistor insulative means and the resistor poly material plus X metal means (476) selectively formed over the X insulative means and extending in the X direction.

21. The binary cell of claim 20, wherein the first voltage contact means comprises: a first portion of the X metal means, and aperture means through the insulative means between the X metal means and the first voltage node for permitting the first portion of the X metal means to contact the first voltage node.

22. The binary cell of claim 9, wherein the second voltage node means further comprises:
a second portion of the X metal means (476:Vdd); and aperature means through the X insulative means for permitting the second portion of the X metal means to contact the portion of the second voltage node means formed by the resistor poly material.

23. The binary cell of claim 20, wherein the contact means comprises:
  wordline contact means; and
  a bit contact means formed by a Y insulative means over the X insulative means and X metal means, plus a flip Y metal means (478:FLIP) and a flop Y metal means (478:FLOP) selectively formed over the Y insulative means and extending in the Y direction.

24. The binary cell of claim 23, wherein the bit contact means further comprises:
  a flip contact aperature means and a flop contact aperature means through the insulative means between the Y metal means and the pass drains, for permitting the flip Y metal means to extend through the flip aperature means and contact the flip pass drain, and for permitting the flop Y metal means to extend through the flop aperature means and contact the flop pass drain.

25. The binary cell of claim 24, wherein aperture means (426:O 446:O) through the Y insulative means are offset from said aperture means through the insulative means between the X metal means and the pass drains.

26. The binary cell of claim 25, wherein the bit contact means further comprises flip and flop polysilicon resistor material formed in the flip and flop aperture means in the gate insulative means and in electrical contact with the flip and flop pass drains.

27. The binary cell of claim 24, wherein the bit contact means further comprises flip and flop portions of the X metal means formed in the flip and flop aperture means in the resistor insulative means.

28. The binary cell of claim 24, wherein the bit contact means further comprises:
  flip and flop polysilicon resistor material formed in the flip and flop aperture means in the gate insulative means and in electrical contact with the flip and flop pass drains; and
  flip and flop portions of the X metal means formed in the flip and flop aperture means in the resistor insulative means and in electrical contact with flip and flop polysilicon resistor material.

29. A memory unit (106) formed within an active region (462:A) of an integrated circuit substrate (460) for an X-Y array memory device (100), and accessed by flip-flop Y metal bit leads and an X metal word line (476:WL) from the device and powered by a first and second metal voltage busses (476:Vss 476:Vdd) disposed parallel to said X metal word line the memory unit comprising:
  a plurality of binary cells positioned about a substrate centerpoint for the unit, and defining a plurality of unit centerlines between adjacent units which intersect at the first centerpoint, each cell symmetrically extending from the first centerpoint into the segment forming a flip pulldown section and a flop pulldown section;
  a first voltage node (414:G) formed in the active region and positioned proximate the substrate centerpoint and symmetrically extending into each cell segment;
  first voltage contact means for coupling the first voltage node to the first voltage buss;
  a second voltage contact means for coupling the unit to the second voltage buss;
  a pulldown node (4422 442) within each pulldown section;
  a pulldown resistor means (424:R 444:R) within each pulldown section coupled between the pulldown node and the second voltage means;
  a pulldown switch within each pulldown section coupled between the pullldown node and said first voltage node, each pulldown switch having a gate responsive to the voltage on the pulldown node of the other pulldown section in that cell in bi-state operation with the pulldown switch in the other section in that cell;
  a pass switch (226:T 246:T) coupled between the pulldown node and one of said flip-flop Y bit leads, and having a gate responsive to the X word line;
  Y access contact means for coupling the pass switch to the Y bit leads; and
  X access contact means for coupling the pass switch to the X word line.

30. The memory unit of claim 29, wherein the memory unit has four cells with two substrate centerlines defining a quadrant segment for each cell.

31. The memory unit of claim 30, wherein each cell extends from the substrate centerpoint in mirror image symmetry with respect to the cells in the two immediately adjacent quadrants.

32. The memory unit of claim 31, wherein each cell quadrant has a power end near one of the substrate centerlines and a access end removed from the one substrate centerline, with the pass switch positioned at the access end of each section.

33. The memory unit of claim 32, wherein the pulldown switch in each pulldown section is a transitor having a drain included in the pulldown node and a source included in the first voltage node.

34. The memory unit of claim 32, wherein the pass switch in each pulldown section is a transistor having a source included in the pulldown node, and a drain coupled to the X contact means.

35. The memory unit of claim 31, wherein said gates for said pass and pulldown switches are formed by:
  gate insulative means (gate oxide) over the active region; and
  conductive polysilicon gate material (420:G 440:G 426:G 446:G) selectively formed over said gate insulative means.

36. The memory unit of claim 35, wherein the channel of each pulldown gate extends between the first voltage node and the pulldown node of that section, and the pulldown gate material (420:G 440:G) having an aligned portion extending in alignment with the X or Y direction and a non-aligned portion.

37. The memory unit of claim 35, wherein the second voltage means within said unit includes a second voltage node formed by a second insulative means over the gate insulative means and the gate material, plus a second polysilicon material (472) selectively formed over the second insulative means.

38. The memory unit of claim 37, wherein the pulldown resistor means (424:R 444:R) within each cell are formed by a portion of the second poly material.

39. The memory unit of claim 38, further comprising:
  a pulldown lead (424:P 444:P) at the pulldown end of each pulldown resistor means formed by:
  a pulldown portion of the second polysilicon material extending over the pulldown nodes; and pulldown contact aperture means (468) in the insulative means between the second polysilicon material and the pulldown node for permitting the second polysilicon material to electrically contact the pulldown node.

40. The memory unit of claim 39, wherein the resistance (724:R) of the flip pulldown lead (424:P) is sufficient to prevent discharge of a flop gate capacitance (740:C) into the flip pulldown node during an ionizing event, and the flop gate capacitance is sufficient to rapidly recharge the flip pulldown node after the ionizing event.

41. The memory unit of claim 9, further comprising:
X insulative means (metal-1 oxide) over the second insulative means and the second poly material; and
X metal means (476) selectively formed over the X insulative means and extending in the X direction.

42. The memory unit of claim 41, wherein the first voltage contact means comprises:
a first portion of the X metal means (476:Vss); and
aperture means through the insulative means between the X metal means and the first voltage node for permitting the first portion of the X metal means to contact the first voltage node (414:G).

43. The memory unit of claim 13, wherein the second voltage means further comprises: a second portion of the X metal means (476:Vdd); and and aperature means through the X insulative means for permitting the second portion of the X metal means to contact the second voltage node formed by the second poly material.

44. The memory unit of claim 41, wherein the Y access contact means is formed by a Y insulative means over the X insulative means and X metal means, plus a flip Y metal means (478:FLIP) and a flop Y metal means (478:FLOP) selectively formed over the Y insulative means and extending in the Y direction.

45. The memory unit of claim 44, wherein the Y access contact means further comprises:
a flip contact aperature means and a flop contact aperature means through the insulative means between the Y metal means and the pass drains for permitting the flip Y metal means to extend through the flip aperature means and contact the flip pass drain, and for permitting the flop Y metal means to extend through the flop aperature means and contact the flop pass drain.

46. The memory unit of claim 45, wherein the aperature means (426:O 446:O) through the Y insulative means are offset from the aperatures means through the insulative means between the X metal means and the pass drains.

47. The memory unit of claim 45, wherein the Y access contact means further comprises:
flip and flop second polysilicon material formed in the flip and flop aperture means in the insulative means between the second polysilicon material and the pass drains; and
flip and flop portions of the X metal means formed in the flop and flop aperture means in the X insulative means, and in electrical contact with flip and flop second polysilicon material.

48. A memory array (102) powered by first and second operating voltages and addressed by a row word line decoder and a column bit decoder, the memory array comprising:
a plurality of identical memory units arranged in rows and columns, each memory unit containing four binary memory cells arranged in four quadrants about a first centerpoint common to all four cells in that memory unit defining row centerlines through each row of memory units and column centerlines through each column of memory units;
each cell having a power end proximate the row centerline, and an access end remote from the row centerline;
a first common voltage node within each memory unit at the centerpoint thereof in electrical contact with each of the four cells in that memory unit;
a second common voltage node positioned along the boundary between adjacent memory units at a boundary point common to four adjacent cells, in electrical contact with each of the four cells adjacent to the boundary point;
first and second metal voltage buss means extending in the row direction across each row of memory units proximate the row centerline thereof, for coupling the first and second common voltage nodes to the first and second operating voltages;
each cell having a flop section proximate the column centerline containing a flop pulldown circuit, and a flip section remote from the column centerline containing a flop pulldown circuit, which circuits cooperate in bi-state operation;
each cell having a flip access circuit and a flop access circuit positioned near the access end thereof and responsive to the row word line decoder and column bit decoder;
word line access buss means including a metal word line buss extending in the row direction across the access end of each row of memory units remote from the row centerline thereof for coupling each access switch to the row word line decoder; and
metal flip bit address buss means extending in the column direction across each column of memory units for coupling each access switch to the column bit decoder.

49. The memory array of claim 48, wherein the cells in the four quadrants are arranged in mirror image symmetry with the cells in the adjacent quadrants.

50. The memory array of claim 2, wherein the first common voltage node within each memory unit is positioned at the first centerpoint and extends into that memory unit in mirror image symmetry with respect to the row and column centerlines.

51. The memory array of claim 3, wherein the boundary lines between adjacent memory units extend in the row and column directions orthogonal to the row and column centerlines, defining a set of three intersections along the boundary lines of each cell.

52. The memory array of claim 51, wherein the second common voltage node within each memory unit is positioned at one of the three intersections, and extends into the adjacent four cell in mirror image symmetry with respect to line forming the intersection.

53. The memory array of claim 52, wherein each circuit includes a transistor having a gate formed by:
gate insulative means over the cells within the memory units; and
conductive polysilicon gate material (420:G 440:G 426:G 446:G) selectively formed over the gate insulative means defining the width of each gate.

54. The memory array of claim 53, wherein the transistor gates in the access circuits extend continuously in the row direction across each row of memory units and function as a polysilicon word line.

55. The memory array of claim 54, wherein each pulldown circuit has a pulldown resistor (424:R 444:R) formed by:
   a resistor insulative means (resistor oxide) over the gate insulative means and the gate material; and a polysilicon resistor material (472) selectively formed over the resistor insulative means; and
   the second voltage node includes a portion of the polysilicon resistor material (414:V).

56. The memory device of claim 55, wherein the first and second metal voltage buss means and the word access buss means are formed by:
   row insulative means (metal-1 oxide) over the resistor insulative means and the polysilicon resistor material; and
   row metal means (476) selectively formed over the row insulative means and extending in the row direction.

57. The memory array of claim 56, further comprising interconnection means formed between the polysilicon row word line and the row metal word line for electrically coupling the two word lines.

58. The memory array of claim 57, wherein the interconnection means occur every sixteenth memory unit.

59. The memory array of claim 56, wherein:
   the first metal voltage buss for each row of memory units extends parallel to the row centerline and off to one side thereof, and has metal tab means extending toward the row centerline over each first voltage node; and
   the second metal voltage buss for each row of memory units extends parallel to the row centerline and off to the other side thereof, and has metal tab means extending toward the row centerline over each second voltage node.

60. A memory array for an integrated circuit powered by a first and second operating voltage, comprising:
   a plurality of identical memory units arranged in rows and columns within the array, each memory unit having four cells positioned in four segments I, II, III, and IV, around a common centerpoint for each memory unit,
   a first voltage node for each memory unit positioned at the common centerpoint therein, for providing each of the four cells with a first operating voltage;
   first voltage means including a first metal buss for coupling the first voltage node to the first operating voltage;
   a second voltage means including a second metal buss for coupling each cell of the array to the second operating voltage and disposed parallel to said first metal buss;
   metal bit lines in electrical communication with each cell and disposed normal to said first and second metal busses; and
   electrically interconnected polysilicon and metal word lines spaced parallel to one another and to said first and second metal busses, and in electrical communication with each cell.

61. The memory array of claim 60, wherein interface lines between adjacent segments within each memory unit intersect at right angles at the common centerpoint and extend in the row and column directions.

62. The memory array of claim 61, wherein the four segments are identical quadrants and the interface line between adjacent quadrants form a row centerline and a column centerline which intersection at the common centerpoint and extending in the row and column directions.

63. The memory array of claim 62, wherein the first voltage node extends symmetrically from the common centerpoint into each of the four cells within that memory unit.

64. The memory array of claim 4, wherein each cell extends from the common centerpoint into the cell in mirror image symmetry with respect to the cells in the two immediately adjacent quadrants.

65. The memory array of claim 64, wherein quadrants I and II are the mirror image of quadrants IV and III across the column centerline for that memory unit, and quadrants I and IV are the mirror image of quadrants II and III across the row centerline for that memory unit.

66. The memory array of claim 64, wherein the cell in quadrant I is identical to the cell in quadrant III rotated 180 degrees, and the cell in quadrant II is identical to the cell in quadrant IV rotated 180 degrees.

67. The memory array of claim 64, wherein boundary lines between adjacent memory units intersect at right angles and extend parallel to the quadrant centerlines in the row and column directions forming row boundary lines and column boundary lines midway between quadrant centerlines.

68. The memory array of claim 67, wherein the second voltage means comprises:
   a second voltage node formed by insulative means over the cells within the memory units, and conductive material selectively formed thereover at a line intersection adjacent to the common centerpoint, for providing the first operating voltage to each of the four cells common to the line intersection; and
   second voltage contact means for coupling the second voltage node to the second operating voltage.

69. The memory array of claim 68, wherein the the second voltage node extends symmetrically from the line intersection into each of the four cells common to the line intersection.

* * * * *